United States Patent
Schramme et al.

(10) Patent No.: US 11,156,643 B2
(45) Date of Patent: Oct. 26, 2021

(54) CURRENT SENSOR WITH OPTIMIZED CURRENT DENSITY DISTRIBUTION, METHOD FOR DETERMINING A LOAD CURRENT

(71) Applicant: Continental Automotive GmbH, Hannover (DE)

(72) Inventors: Martin Schramme, Königsbrunn (DE); Ralf Schröppel, Thalmassing (DE); Andreas Aumer, Burglengenfeld (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 138 days.

(21) Appl. No.: 16/489,780

(22) PCT Filed: Feb. 28, 2018

(86) PCT No.: PCT/EP2018/054957
§ 371 (c)(1),
(2) Date: Aug. 29, 2019

(87) PCT Pub. No.: WO2018/158330
PCT Pub. Date: Sep. 7, 2018

(65) Prior Publication Data
US 2020/0011905 A1  Jan. 9, 2020

(30) Foreign Application Priority Data

Mar. 3, 2017 (DE) ..................... 10 2017 203 535.8

(51) Int. Cl.
*G01R 19/00* (2006.01)
*G01R 1/20* (2006.01)
*G01R 35/00* (2006.01)

(52) U.S. Cl.
CPC ......... *G01R 19/0092* (2013.01); *G01R 1/203* (2013.01); *G01R 35/005* (2013.01)

(58) Field of Classification Search
CPC ...... G01R 1/203; G01R 15/12; G01R 15/144; G01R 21/06; G01R 31/3191; G01R 33/0023; G01R 35/00; G01R 35/005
(Continued)

(56) References Cited

U.S. PATENT DOCUMENTS

| 5,214,407 A | 5/1993 | McKim et al. |
| 7,363,186 B1 | 4/2008 | Costello et al. |

(Continued)

FOREIGN PATENT DOCUMENTS

| CN | 101236439 A | 8/2008 |
| CN | 103827674 A | 5/2014 |

(Continued)

OTHER PUBLICATIONS

Chinese Office Action for Chinese Application No. 201880029136.1, dated Mar. 29, 2021 with partial translation, 15 pages.

*Primary Examiner* — Tung X Nguyen
*Assistant Examiner* — Robert P Alejnikov, Jr.
(74) *Attorney, Agent, or Firm* — RatnerPrestia

(57) ABSTRACT

A current sensor including a measurement circuit and an electrical conductor having at least one first measurement path defined by a first pickup contact and a second pick-up contact at which a first voltage can be detected across the first measurement path, a first connection contact for electrically contacting a connection element, a second connection contact for electrically contacting a battery pole terminal, and a current feed contact for electrically contacting a device for providing a calibration current. The first measurement path is in series between the first connection contact and the second connection contact. A calibration current supplied at the current feed contact induces a current density distribution in the first measurement path, which converges with a current density distribution in the first (Continued)

measurement path, induced by a load current of equal current intensity supplied at the first connection contact.

17 Claims, 11 Drawing Sheets

(58) Field of Classification Search
USPC .................................. 324/76.11, 750.02, 601
See application file for complete search history.

(56) References Cited

U.S. PATENT DOCUMENTS

| | | | |
|---|---|---|---|
| 8,884,733 B2 | 11/2014 | Hetzler | |
| 9,360,500 B2 | 6/2016 | Schramme et al. | |
| 9,632,163 B2 | 4/2017 | Mueller et al. | |
| 10,317,439 B2 | 6/2019 | Ausserlechner | |
| 2005/0127918 A1 | 6/2005 | Kutkut et al. | |
| 2008/0079415 A1* | 4/2008 | Mirescu | G01R 1/203 |
| | | | 324/76.11 |
| 2011/0234189 A1 | 9/2011 | Tanihara et al. | |
| 2012/0086430 A1 | 4/2012 | Marten | |
| 2013/0154672 A1 | 6/2013 | Fabregas et al. | |
| 2014/0184199 A1 | 7/2014 | Mueller et al. | |
| 2014/0191768 A1 | 7/2014 | Engl | |
| 2014/0191772 A1 | 7/2014 | Hetzler | |
| 2016/0041206 A1 | 2/2016 | Hetzler | |
| 2016/0054422 A1 | 2/2016 | Nemani | |
| 2016/0291059 A1* | 10/2016 | Ausserlechner | G01R 19/32 |
| 2016/0291060 A1 | 10/2016 | Wood et al. | |
| 2016/0305989 A1* | 10/2016 | Soma | G01R 19/32 |
| 2018/0172736 A1* | 6/2018 | Makinson | G01R 1/203 |
| 2019/0094304 A1 | 3/2019 | Aumer et al. | |

FOREIGN PATENT DOCUMENTS

| | | |
|---|---|---|
| CN | 105074477 A | 11/2015 |
| CN | 105486907 A | 4/2016 |
| CN | 106093521 A | 11/2016 |
| CN | 205691625 U | 11/2016 |
| DE | 202009000098 U1 | 4/2009 |
| DE | 102010035485 A1 | 3/2012 |
| DE | 102011078334 A1 | 1/2013 |
| DE | 102011113002 A1 | 3/2013 |
| DE | 102014207759 A1 | 1/2015 |
| DE | 102015105075 A1 | 10/2016 |
| DE | 102016206958 A1 | 10/2017 |
| EP | 2042879 A1 | 4/2009 |
| EP | 2752672 A1 | 7/2014 |
| WO | 2016041658 A1 | 3/2016 |

* cited by examiner

CURRENT SENSOR WITH OPTIMIZED CURRENT DENSITY DISTRIBUTION, METHOD FOR DETERMINING A LOAD CURRENT

CROSS REFERENCE TO RELATED APPLICATIONS

This application is the U.S. National Phase Application of PCT International Application No. PCT/EP2018/054957, filed Feb. 28, 2018, which claims priority to German Patent Application No. 10 2017 203 535.8, filed Mar. 3, 2017, the contents of such applications being incorporated by reference herein.

FIELD OF THE INVENTION

The present invention relates to a current sensor for detecting a current flow out of or into a vehicle battery, and to a method for determining a load current flowing through an electrical conductor of a current sensor.

BACKGROUND OF THE INVENTION

Such a current sensor can be used, in particular, to determine the battery condition of a battery, for example an automobile battery. In order to determine a battery condition, it is typically necessary to measure the battery current. This can also be referred to as the load current. For this purpose, highly accurate resistors or sensors are typically used to measure the magnetic field strength in embodiments according to the prior art. The disadvantages of the previous embodiments are, in particular, the high costs, in particular for creating resistor materials which have more or less constant resistance values in a conventional temperature range of −40° C. to 105° C., for example. One example of such a material is a copper/nickel/manganese alloy, for example Manganin.

A current measurement may be provided, for example, for use in battery sensors for the downstream calculation of physical variables of a battery.

There have been approaches for some time to replacing a highly precise resistor as a measuring resistor, also referred to as a shunt resistor or measurement path, with more cost-effective components. One possibility is to recalibrate a shunt resistor again and again over the service life of the battery sensor.

However, it has been found that continuous recalibration even while simultaneously measuring the high and temporally greatly variable currents occurring in the motor vehicle is difficult under the prevailing boundary conditions, in particular a desired low power consumption of the sensor, since the calibration current to be applied for calibration is intended to be selected to be small and is intended to be applied only briefly.

SUMMARY OF THE INVENTION

The aspect of the invention is a current sensor, which is particularly inexpensive and enables a better and/or more accurate determination of the load current in comparison to known designs. An aspect of the invention is also an associated method.

An aspect of the invention preferably relates alternatively to a current sensor for detecting a current out of or into a vehicle battery, comprising a measurement circuit, in particular a device for providing an output signal, and an electrical conductor. In this regard, the electrical conductor comprises at least a first measurement path, which is defined by means of a first potential pick-up contacting means and a second potential pick-up contacting means. A first voltage can then be detected across the first measurement path by means of the first potential pick-up contacting means and the second potential pick-up contacting means. In this regard, the electrical conductor has a first connection contact for electrically contacting a connection element. In addition, the electrical conductor has a second connection contact for electrically contacting a battery pole terminal. The electrical conductor also has a current feed contacting means for electrically contacting a device for providing a calibration current. In this case the first measurement path is formed in series between the first connection contact and the second connection contact. Particularly preferably the electrical conductor, on the basis of its geometrical parameters and contacting means, in particular with regard to its composition and/or positioning of the contacting means on the electrical conductor, is designed in such a way that a calibration current that can be supplied at the current feed contacting means would induce a current density distribution in the first measurement path and/or a current density profile along the first measurement path and/or a potential distribution in the first measurement path, which would converge with a current density distribution in the first measurement path and/or a current density profile along the first measurement path and/or a potential distribution in the first measurement path, which would be induced by a load current of equal current intensity that can be supplied at the first connection contact.

Contacting means are preferably understood to mean the current feed contacting means and/or the first potential pick-up contacting means and/or the second potential pick-up contacting means and/or the first connection contact and/or the second connection contact.

A calibration current supplied at the current feed contacting means preferably generates the same voltage on the first measurement path as a load current of the same current intensity, which is fed in at the first connection contact and, in particular, flows to the second connection contact.

An aspect of the invention is preferably also based on the idea that a point-like injection of the calibration current generates substantially circular electrical equipotential surfaces in the area surrounding the current feed contacting means. In particular, this results in an inhomogeneous distribution of the current density in the region around the current feed contacting means along the cross-sectional area of the electrical conductor.

It is preferable that the first measurement path is a conductor segment with a defined length, width and height, the first potential pick-up contacting means and the second potential pick-up contacting means being arranged at one edge of the first measurement path, the length of the first measurement path being thereby defined by a distance from the first potential pick-up contacting means to the second potential pick-up contacting means, wherein in particular the width of the first measurement path is greater than the height of the first measurement path.

Preferably, the first potential pick-up contacting means and the second potential pick-up contacting means are arranged on opposite sides or side edges or outer edges of the first measurement path.

It is preferable that the current feed contacting means is spaced at a first distance from the first measurement path, the first measurement path being a conductor segment with a defined length, width and height, the first potential pick-up contacting means and the second potential pick-up contacting means being arranged on one edge of the first measurement path, the length of the first measurement path being thereby defined by a distance between the first potential pick-up contacting means and the second potential pick-up up contacting means, wherein in particular the width of the first measurement path is greater than the height of the first measurement path, the first distance being greater than ⅛ or ⅖ or ⅜ or ⅘ or ⅝ or ⅞ or ⅞ or ⅞ of the width of the first measurement path.

It is preferable for the electrical conductor to have a second measurement path, defined by a third potential pick-up contacting means and a fourth potential pick-up contacting means, at which a second voltage across the second measurement path can be detected.

It is particularly preferable that the second measurement path is a conductor segment with a defined length, width and height, the third potential pick-up contacting means and the fourth potential pick-up contacting means being arranged at one edge of the first measurement path, the length of the first measurement path being thereby defined by a distance from the third potential pick-up contacting means to the fourth potential pick-up contacting means, wherein in particular the width of the second measurement path is greater than the height of the second measurement path.

Preferably, the third potential pick-up contacting means and the fourth potential pick-up contacting means are arranged on opposite sides or side edges or outer edges of the second measurement path.

It is particularly preferable that the second measurement path and the first measurement path are implemented in series with each other between the first connection contact and the second connection contact, wherein in particular the current feed contacting means is located in series between the second measurement path and the first measurement path.

An aspect of the invention is preferably based on the idea that the supply of the calibration current at the current feed contacting means essentially causes no inhomogeneous current density distribution along the cross-sectional area of the first measurement path and/or the second measurement path.

Preferably, the cross-sectional area is given by a width and height of the first measurement path and/or of the second measurement path.

It is preferable that the electrical conductor, on the basis of its geometrical parameters and contacting means, is implemented in such a way that a current density, induced by the calibration current that can be supplied at the current feed contacting means, converges to zero in the second measurement path.

It is preferable that the current feed contacting means is spaced at a second distance from the second measurement path, the second distance being greater than ⅛ or ⅖ or ⅜ or ⅘ or ⅝ or ⅞ or ⅞ of the width of the second measurement path.

It is preferable that the electrical conductor has a first subregion, in which the current feed contacting means is arranged, wherein the length of the first subregion is bounded by the first measurement path and the second measurement path, the first subregion having a greater width and/or height and/or thicker material thickness than the first measurement path and/or the second measurement path.

Particularly preferably, the width and/or height and/or material thickness is larger and/or thicker by at least ⅒ than the first measurement path and/or the second measurement path.

It is preferable that a first subregion of the electrical conductor in which the current feed contacting means is arranged, the length of the first subregion being bounded by the first measurement path and the second measurement path, has a lower relative resistance value than the first measurement path and/or the second measurement path.

The first subregion particularly preferably has a larger cross-sectional area than the first measurement path and/or the second measurement path. In particular, the first subregion is wider.

The first subregion particularly preferably has a lower specific resistance value than the first measurement path and/or the second measurement path.

It is preferable that a distance from the second measurement path to the first measurement path, which is defined by the distance from the fourth potential pick-up contacting means to the first potential pick-up contacting means, is less than the sum of the distances between the fourth potential pick-up contacting means and the current feed contacting means and between the current feed contacting means and the first potential pick-up contacting means.

The distance from the second measurement path to the first measurement path is preferably equal to the length of the first subregion. In particular, the distance from the second measurement path to the first measurement path is defined by the potential pick-up contacting means arranged on opposite edges or sides or side edges or outer edges of the first subregion. The distance from the second measurement path to the first measurement path is particularly preferably defined by the inner potential pick-up contacting means.

Connecting lines between the fourth potential pick-up contacting means, the current feed contacting means and the first potential pick-up contacting means preferably form a triangle.

Preferably, the second measurement path and the first measurement path are arranged at an angle to each other, in particular at a right angle. As a result, the first measurement path and the second measurement path in particular do not lie on a straight line.

It is preferable that the electrical conductor has a current output contacting means to form a closed electrical circuit of the calibration current.

It is particularly preferable that the current output contacting means is spaced at a third distance from the first measurement path, the first measurement path being a conductor segment with a defined length, width and height, the first potential pick-up contacting means and the second potential pick-up contacting means being arranged on one edge of the first measurement path, the length of the first measurement path being thereby defined by a distance between the first potential pick-up contacting means and the second potential pick-up contacting means, wherein in particular the width of the first measurement path is greater than the height of the first measurement path, the first distance being greater than ⅛ or ⅖ or ⅜ or ⅘ or ⅝ or ⅞ or ⅞ or ⅞ of the width of the first measurement path.

It is preferable that the electrical conductor has a first subregion in which the current feed contacting means is arranged, wherein the first subregion has a width, the width being reduced and/or tapered in an area around the current feed contacting means, wherein in particular the region around the current feed contacting means has a constriction.

It is preferred that the electrical conductor has a first tapered section, which is spaced no more than a fourth distance from the current feed contacting means, the fourth distance being less than ⅛ or ⅖ or ⅜ or ⅘ or ⅝ or ⅞ or ⅞ or ⅞ of a width of the first measurement path.

It is preferable that the electrical conductor has a second subregion in which the current output contacting means is arranged, the length of the second subregion being bounded by the first measurement path and the second connection contact, the second subregion having a width, wherein the width is reduced and/or tapered in an area around the current output contacting means, in particular the region around the current output contacting means having a constriction.

It is preferred that the electrical conductor has a second tapered section, which is spaced no more than a fifth distance from the current output contacting means, the fifth distance being less than 1/8 or 2/8 or 3/8 or 4/8 or 5/8 or 6/8 or 7/8 or 8/8 of a width of the first measurement path.

It is preferable that the electrical conductor has a first subregion, in which the current feed contacting means is arranged, the length of the first subregion being bounded by the first measurement path and second measurement path, wherein at least one surface, in particular two surfaces, of the first subregion are oval-shaped or circular or funnel-shaped.

It is preferable that the first measurement path and/or the second measurement path have a homogeneous current density distribution, or homogeneous current density, under a load current and calibration current that are or can be supplied.

It is preferable for the electrical conductor is made from a uniform material.

The current feed contacting means is preferably spaced apart from the first measurement path.

The current feed contacting means is preferably spaced apart from the second measurement path.

The current feed contacting means is preferably point-like.

It is preferable that the current feed contacting means is formed over a majority of the circumference of the electrical conductor.

The current feed contacting means is preferably formed outside the first measurement path and outside the second measurement path.

The current sensor preferably comprises a housing, in which the measurement circuit is embedded and, in particular, the electrical conductor is partially embedded.

The current output contacting means is preferably formed outside the first measurement path and outside the second measurement path.

An aspect of the invention additionally relates to a method for determining a load current flowing through an electrical conductor of a current sensor,
the method comprising the following steps:
measuring a first measurement voltage, which is dropped across the first measurement path,
calculating the load current on the basis of at least the first measurement voltage and an operating parameter,
wherein the method has the following steps solely during respective calibration periods:
passing a calibration current into the current feed contacting means, and
measuring a first calibration voltage, which is dropped across the first measurement path at least when a calibration current is flowing,
wherein an operating parameter is calculated on the basis of at least the first calibration voltage and a current intensity of the calibration current.
Preferably, the current sensor has:
at least one first voltmeter and in particular one second voltmeter, wherein the first voltmeter is configured to measure a voltage dropped across the first measurement path and the second voltmeter is configured to measure a voltage dropped across the second measurement path,
at least one device for supplying a calibration current, which is configured to pass a calibration current through the first measurement path, and
an electronic control apparatus, which is configured to carry out a method.

The method for determining a load current flowing through an electrical conductor of a current sensor preferably relates to a method for determining a load current flowing through a measuring resistor group. The measuring resistor group has a number of branches, and each branch has an electrical conductor according to an aspect of the invention.

The method preferably has the following steps for each of the branches:
measuring a first measurement voltage, which is dropped across the first measurement path, and a second measurement voltage, which is dropped across the second measurement path,
calculating a first operating parameter on the basis of the first measurement voltage and the second measurement voltage,
calculating the load current on the basis of at least the second measurement voltage and a second operating parameter,
wherein the method has the following steps solely during respective calibration periods:
conducting a calibration current into the current feed contacting means, wherein the calibration current is divided into a first calibration partial current flowing through the first measurement path and a second calibration partial current flowing through the second measurement path, and
measuring a first calibration voltage, which is dropped across the first measurement path in the case of a flowing calibration current and load current, and a second calibration voltage, which is dropped across the second measurement path in the case of a flowing calibration current and load current,
wherein the second operating parameter is calculated on the basis of at least the first calibration voltage, the second calibration voltage, the first operating parameter and a current intensity of the calibration current.

The method according to an aspect of the invention advantageously makes it possible to determine a load current.

For this purpose, a measuring resistor originally comprising only a single resistor can be generalized to a group of measuring resistors having at least one branch with at least two measurement paths. It should be understood that any desired number of branches can be used, that is to say one branch, two branches, three branches or more branches, for example.

The load currents may each be, in particular, those parts of an overall load current which flow through the respective branch.

It should preferably be understood that a voltage dropped across a respective measurement path, that is to say a measurement voltage or calibration voltage, can fundamentally be measured both directly across the respective measurement path or can be measured in such a manner that an overall voltage is measured across a plurality of resistors, for example two resistors, and a voltage dropped across another resistor is subtracted therefrom. These embodiments are equivalent in the sense of this application and should both be accordingly included in the formulations used here.

It should preferably be understood that, in the step of calculating the load current on the basis of at least the second measurement voltage and a second operating parameter, the first measurement voltage or a sum of the first measurement voltage and the second measurement voltage can also be used as an alternative to the second measurement voltage. Such variants should be considered to be equivalent.

In the case of a plurality of branches, the respective calculated load currents of the branches are preferably added to form an overall load current.

With regard to the details of the procedure, reference is made to the embodiments below. The first calibration current is preferably different to, in particular in opposition to, the second calibration current based on a current direction of the load current. This results in advantageous solvability of systems of equations which are described in more detail further below.

According to one embodiment, the second calibration partial current is zero. This makes it possible to dispense with a current source and enable a particularly simple evaluation. It should be understood that those embodiments in which a calibration partial current is therefore zero, for example, are included in the disclosure above.

The second operating parameter preferably corresponds to a product of a resistance value of the second measurement path and a gain factor of a voltmeter measuring the second measurement voltage.

The second operating parameter can be calculated, in particular, as the difference between a first fraction and a second fraction, wherein the numerator of the first fraction contains the second reference voltage, wherein the denominator of the first fraction contains the current intensity of the calibration current, wherein the numerator of the second fraction contains the first reference voltage, and wherein the denominator of the second fraction contains a product of the first operating parameter and the current intensity of the calibration current. This allows an advantageous calculation of the second operating parameter, in particular for the meaning stated above. With respect to the mathematical background, reference is made to the embodiment below.

It should be understood that, in the case of equations or formulas stated in this application, whether stated in text form or as a formula, certain transformations, in particular trivial transformations, are fundamentally also considered to be equivalent and do not depart from the scope of protection. For example, an equation can be multiplied by a constant. The first operating parameter preferably corresponds to a ratio between a product of the resistance value of the second measurement path and the gain factor of a voltmeter measuring the second measurement voltage, and a product of the resistance value of the first measurement path and the gain factor of a voltmeter measuring the first measurement voltage.

In this case, the first operating parameter is preferably calculated by dividing the first measurement voltage by the second measurement voltage or by means of a regression analysis on the basis of the first measurement voltage and the second measurement voltage. This allows, in particular, an advantageous calculation of the first operating parameter for the meaning stated above.

The first operating parameter is preferably calculated outside calibration periods, in particular if the measurement voltages are also being measured.

According to one embodiment, the load current is calculated during respective calibration periods by extrapolating load currents from times outside calibration periods. This takes into account the fact that, depending on the embodiment, it may be difficult or even impossible to exactly calculate the load current during a calibration period, that is to say with a superimposed calibration current.

According to one embodiment, the second calibration partial current is zero, and the load current is calculated during respective calibration periods on the basis of the second calibration voltage, the second operating parameter and the current intensity of the calibration current. This takes into account, in particular, the fact that it is possible to exactly calculate the load current even during a calibration period, in particular if the second calibration partial current is zero.

In this case, the load current can be determined in two different exemplary ways, in particular. On the one hand, it can be calculated from the first calibration voltage, divided by the second operating parameter, minus the known calibration current and, on the other hand, it can be calculated from the second calibration voltage, divided by the product of the first and second operating parameters.

The end result is advantageously output or calculated as the mean value of the two methods just mentioned.

According to one embodiment, the load current is calculated outside calibration periods by dividing the second measurement voltage by the second operating parameter.

According to one embodiment, the load current is calculated during calibration periods by dividing the first calibration voltage by the second operating parameter minus a correction value, wherein the correction value is preferably the current intensity of the calibration current, in particular if the second calibration partial current is zero.

It would also be possible to use an estimated value for dividing the calibration current. On account of the typically known nominal resistance values of the first measurement path and of the second measurement path, it is typically possible to estimate how the current will be divided. As long as the calibration current is small in comparison with the load current, this usually produces only a small error.

The current intensity of the calibration current can be determined, in particular, on the basis of a measured voltage drop at a reference resistor, wherein this reference resistor is, in particular, a temperature-stable and/or long-term stable reference resistor. The latter has a known resistance.

It should be mentioned that the calibration current is therefore typically measured in the first instance only in total, that is to say without knowledge of the two calibration partial currents. Numerous possibilities are conceivable for measuring the calibration current. The voltage measurement across a reference resistor just mentioned is one example of this. Another possibility would be to obtain the calibration current from a precise current source.

According to one development, an error value for the load current is calculated on the basis of the current intensity of the reference resistor. This makes it possible to estimate the reliability of the determined load current.

The electronic control device preferably controls the supply of the calibration current.

The electronic control apparatus can have, in particular, processor means and storage means, wherein the storage means store program code, during the execution of which the processor means carry out a method according to an aspect of the invention or behave accordingly.

According to one embodiment, the group of measuring resistors has a single branch. This corresponds to a simple embodiment.

According to one embodiment, the group of measuring resistors has a plurality of branches. This makes it possible to take into account different current intensities, for example.

A number of multiplexers may also be provided in order to assign a voltage measurement and/or conduction of the calibration current to a particular branch. This makes it possible to use measuring instruments or current sources for different branches, which saves expenditure.

The group of measuring resistors may have a plurality of branches. In this case, the load current is preferably calculated in a manner summed over all branches. In this case, it is possible to refer to an overall load current which results from summing the respective load currents in the branches.

An aspect of the invention further relates to a nonvolatile, computer-readable storage medium which contains program code, during the execution of which a processor carries out a method according to an aspect of the invention. In respect of the method, reference can be made to all of the described embodiments and variants.

BRIEF DESCRIPTION OF THE DRAWINGS

Further features and advantages will be gathered by a person skilled in the art from the exemplary embodiments described below with reference to the appended drawing. In the drawing.

DETAILED DESCRIPTION OF THE PREFERRED EMBODIMENTS

Figure 1:
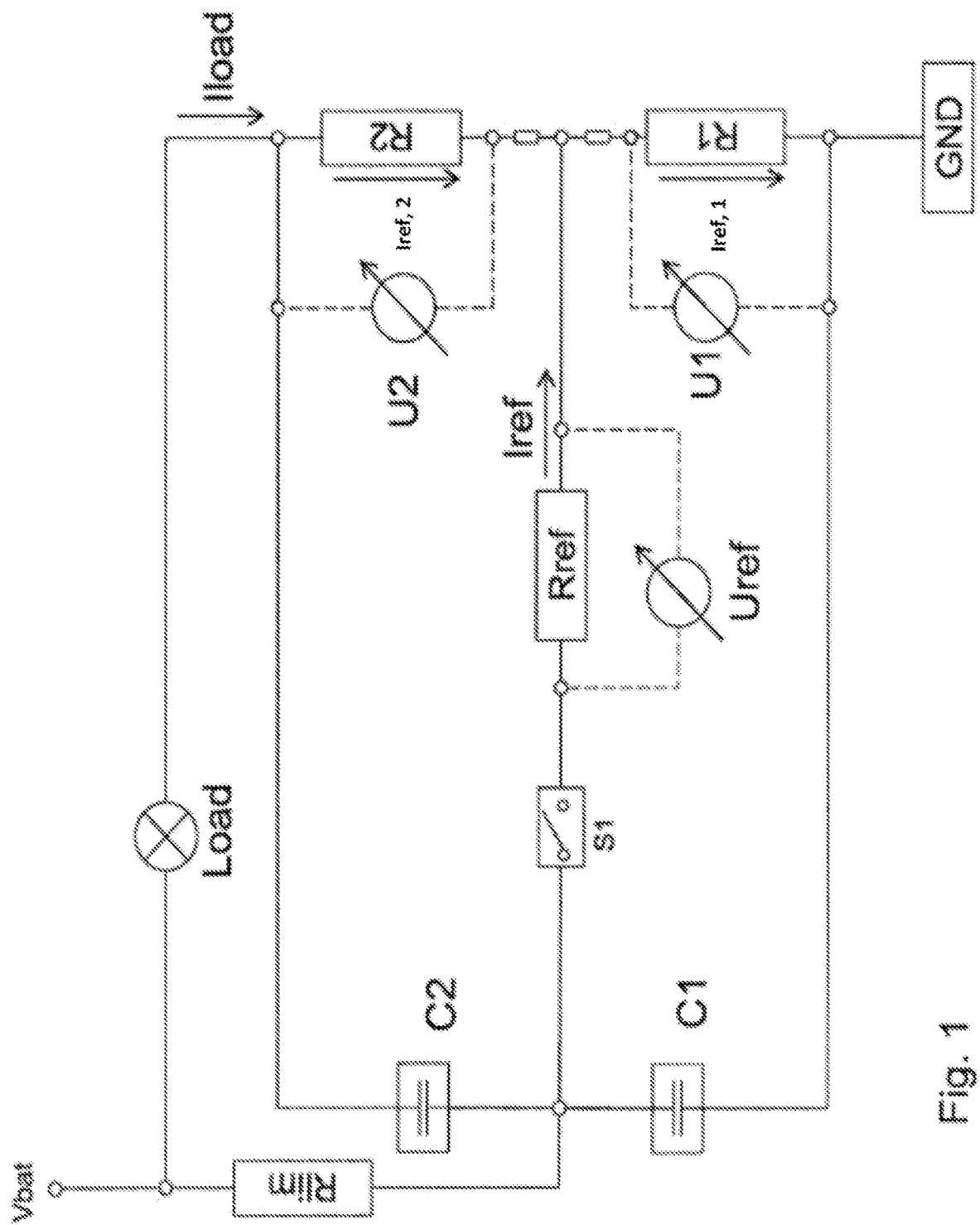
FIG. 1: shows a group of measuring resistors with connection according to a first exemplary embodiment.

FIG. 1 shows a group of measuring resistors with connection according to a first exemplary embodiment which can also be advantageously used to carry out the method according to an aspect of the invention.

The group of measuring resistors has a first measuring resistor R1 and a second measuring resistor R2, via which a temporally variable load current Iload is conducted. This load current Iload initially comes from a battery which is depicted, in terms of voltage, as Vbat in FIG. 1. The load current Iload also flows via a load which is generally referred to as Load and is only schematically illustrated here and may comprise typical electrical components of a motor vehicle, for example a starter motor, a vehicle light or electronic components as well as a generator.

A first voltmeter U1 is arranged across the first measuring resistor R1. A second voltmeter U2 is arranged across the second measuring resistor R2. These are designed to measure respective voltages across the two measuring resistors R1, R2 when a current I1, I2 is respectively flowing through.

A first capacitor C1 and a second capacitor C2 are used as current sources for a calibration current Iref and are directly charged from the vehicle battery via a series resistor Rlim. The load current Iload is generated from the battery Vbat via the load Load and flows to ground GND via the resistor network of the measuring resistors R1, R2.

The two capacitors C1, C2 are connected to a point between the first measuring resistor and the second measuring resistor via a switch S1 and a reference resistor Rref. Between this point and the measuring resistor R1 or the measuring resistor R2, conductor resistances are formed. The voltmeter U1 or the voltmeter U2 is arranged across the measuring resistor R1 or the measuring resistor R2. A further voltmeter Uref is arranged across the reference resistor Rref and measures a voltage dropped across the reference resistor Rref when a calibration current Iref is flowing through.

As a result of the switch S1 being closed, a calibration current Iref is therefore fed into the resistor network comprising the measuring resistors R1, R2 in addition to the load current Iload, wherein the first capacitor C1 is substantially discharged via the first measuring resistor R1 and the second capacitor C2 is substantially discharged via the second measuring resistor R2. This consequently produces two calibration partial currents, namely a first calibration partial current Iref,1 and a second calibration partial current Iref,2, wherein the first calibration partial current Iref,1 flows through the first measuring resistor R1 and the second calibration partial current Iref,2 flows through the second measuring resistor R2. The two calibration partial currents Iref,1 and Iref,2 have mathematical signs which are opposite across the two measuring resistors R1, R2, whereas their sum Iref flows through the reference resistor Rref and can be measured using a voltage measurement, as already described.

The voltmeters U1, U2 for measuring the voltages dropped across the two measuring resistors R1, R2 are not explained in any further detail in the present case. The voltmeters U1, U2 each typically have at least one amplifier, generally with a variable gain factor, and each have an analog/digital converter or else a common analog/digital converter which can be connected to each amplifier via a multiplexer.

An arithmetic unit, for example an electronic control apparatus which may be in the form of a microcontroller, for example, is not depicted in FIG. 1. Such an electronic control apparatus can have, for example, processor means and storage means, wherein the storage means store program code, during the execution of which the processor means carry out a method according to an aspect of the invention. In particular, the processor means can calculate the load current Iload according to the formulas mentioned above. The arithmetic unit or the electronic control apparatus may preferably also have an interface for reading in the voltages U1, U2, Uref and an interface for controlling the switch S1.

It should be mentioned that, instead of the capacitors C1, C2, any desired other type of current source can be used. For example, it is possible to use DC/DC converters, a direct connection to the positive pole of a battery (with or without series resistor Rlim), in-phase regulators, regulated precision current sources (in particular with omission of the Iref measurement via Rref) or else other suitable embodiments.

It should also be pointed out that parts of the calculations; in particular the calculation of a sum of voltages (Un, Um) measured across the measuring resistors and/or a difference between these voltages (Un−Um), can also be carried out in an analog form before the measured values are digitized.

Figure 2:
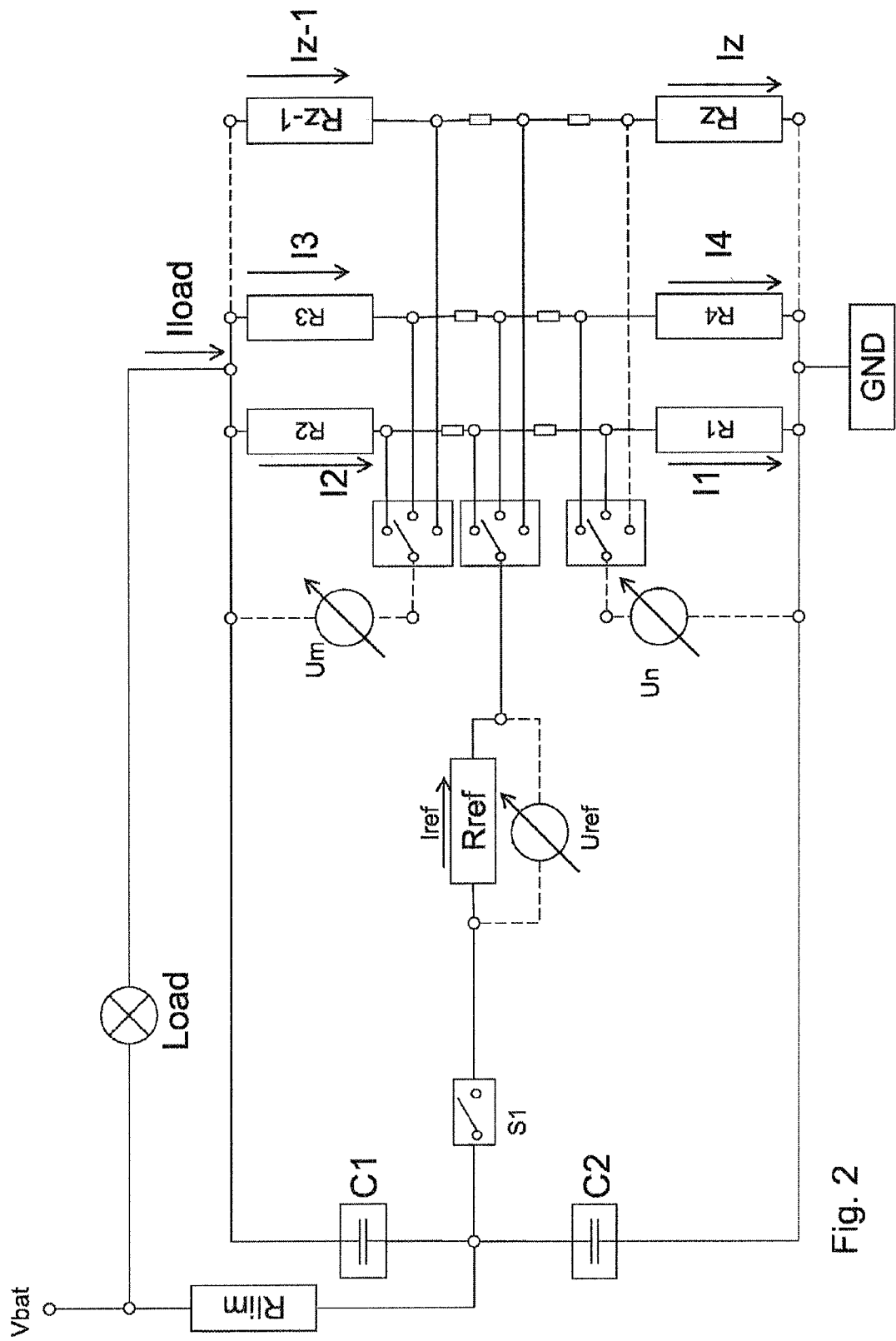
FIG. 2: shows a group of measuring resistors with connection according to a second exemplary embodiment.

FIG. 2 shows a group of measuring resistors with connection according to a second exemplary embodiment. It should be mentioned that the changes with respect to the previous figures are substantially discussed in FIG. 2 and in the further figures, in which case reference is made to the previous description with regard to elements which are not specifically mentioned.

In the embodiment according to FIG. 2, the resistor network or the group of measuring resistors comprises a plurality of measuring resistors R1, R2, R3, R4, . . . , Rz, Rz-1 connected in parallel and in series. One advantage of this embodiment is, in particular, that an overall lower measuring resistance is achieved in the Iload path as a result of a plurality of resistor branches being connected in parallel, whereas the measuring resistors R1, R2, . . . , Rz-1, Rz can be relatively large. Therefore, even with a low applied calibration current in comparison with the load current, a relatively high, that is to say easily measurable, voltage drop is produced at the respective measuring resistor.

Preferably two, in particular three, different multiplexers or more are used, one of which is used for switching the reference currents and a second and, in particular, a third is used for switching the voltmeter to the respective branch of the resistor network.

In particular, the feed point for the reference current and the edges of the measurement paths for the partial currents are spatially separated from each other.

Instead of the multiplexer for the reference current, it is also possible to use one current source and/or one voltage measuring device for each measuring resistor R1, R2, . . . , Rz-1, Rz, for example.

Figure 3:
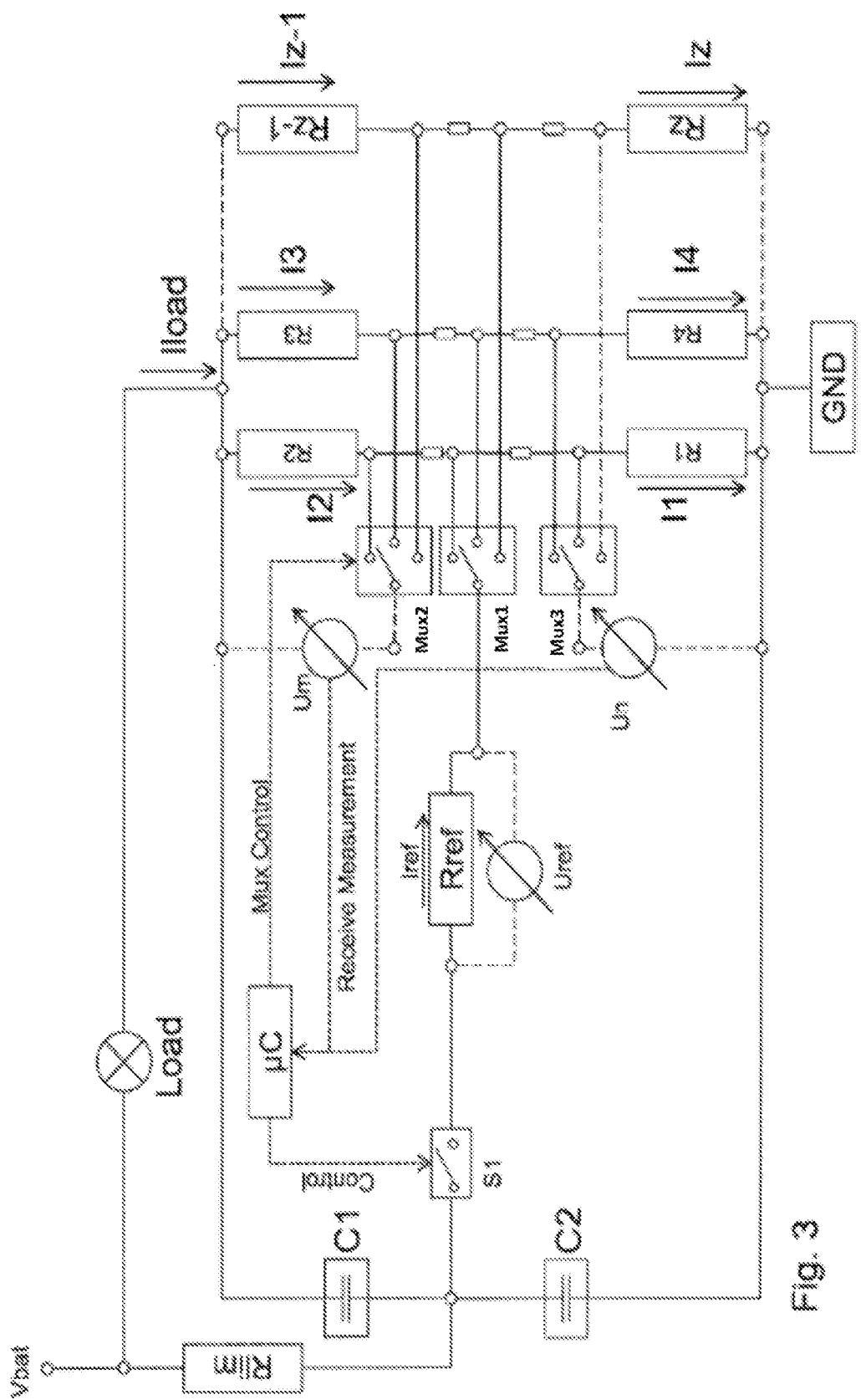
FIG. 3: shows a group of measuring resistors with connection according to a third exemplary embodiment.

FIG. 3 shows a group of measuring resistors with connection according to a third exemplary embodiment of an aspect of the invention. In this case, a separate multiplexer Mux1 is used to switch the calibration current Iref to any desired branch (R1, R2), (R3, R4), . . . , (Rz-1, Rz) of the resistor network, a second multiplexer Mux2 for connecting the voltmeter Urn and a third multiplexer Mux3 for switching the voltmeter Un to any desired branch (R1, R2), (R3, R4), . . . , (Rz-1, Rz) of the resistor network. A microcontroller μC controls the multiplexers Mux1, Mux2 and Mux3 and the switch S1 and receives the measured values Un, Um, Uref.

The microcontroller μC is an electronic control apparatus and is configured to carry out a method according to an aspect of the invention. In this case, it is possible, in principle, to refer back to all the embodiments and variants described.

Figure 4:
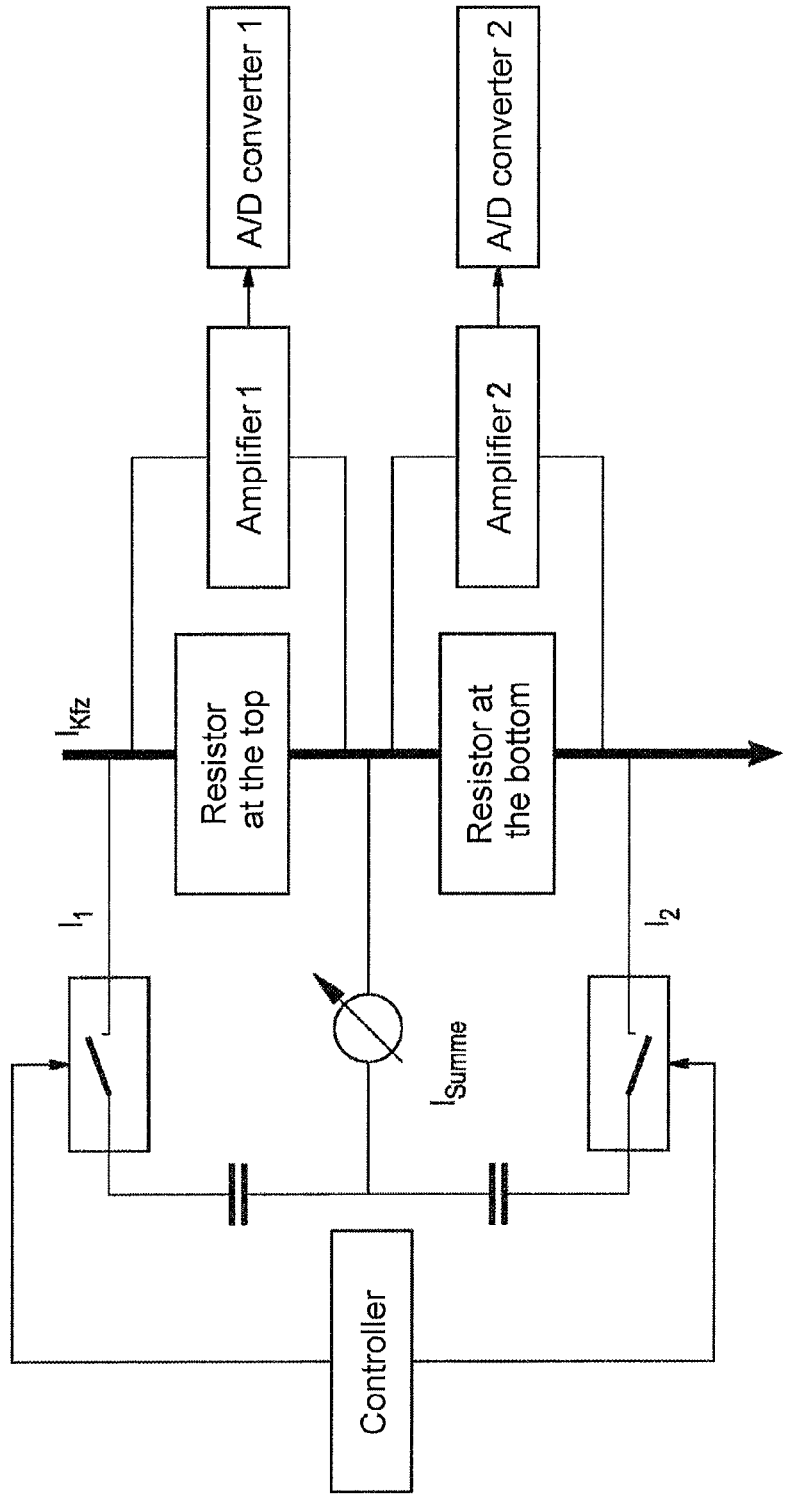
FIG. 4: shows a group of measuring resistors with connection according to a fourth exemplary embodiment.

FIG. 4 shows a group of measuring resistors with connection according to a fourth exemplary embodiment of an aspect of the invention, in which the calibration currents ISumme can be deliberately switched separately by the controller via different measuring resistors (resistor at the top, resistor at the bottom) of a resistor branch. The voltage measurement is divided, in detail, into the steps of amplification (amplifier 1, amplifier 2) and analog/digital conversion (A/D converter 1, A/D converter 2).

Figure 5:
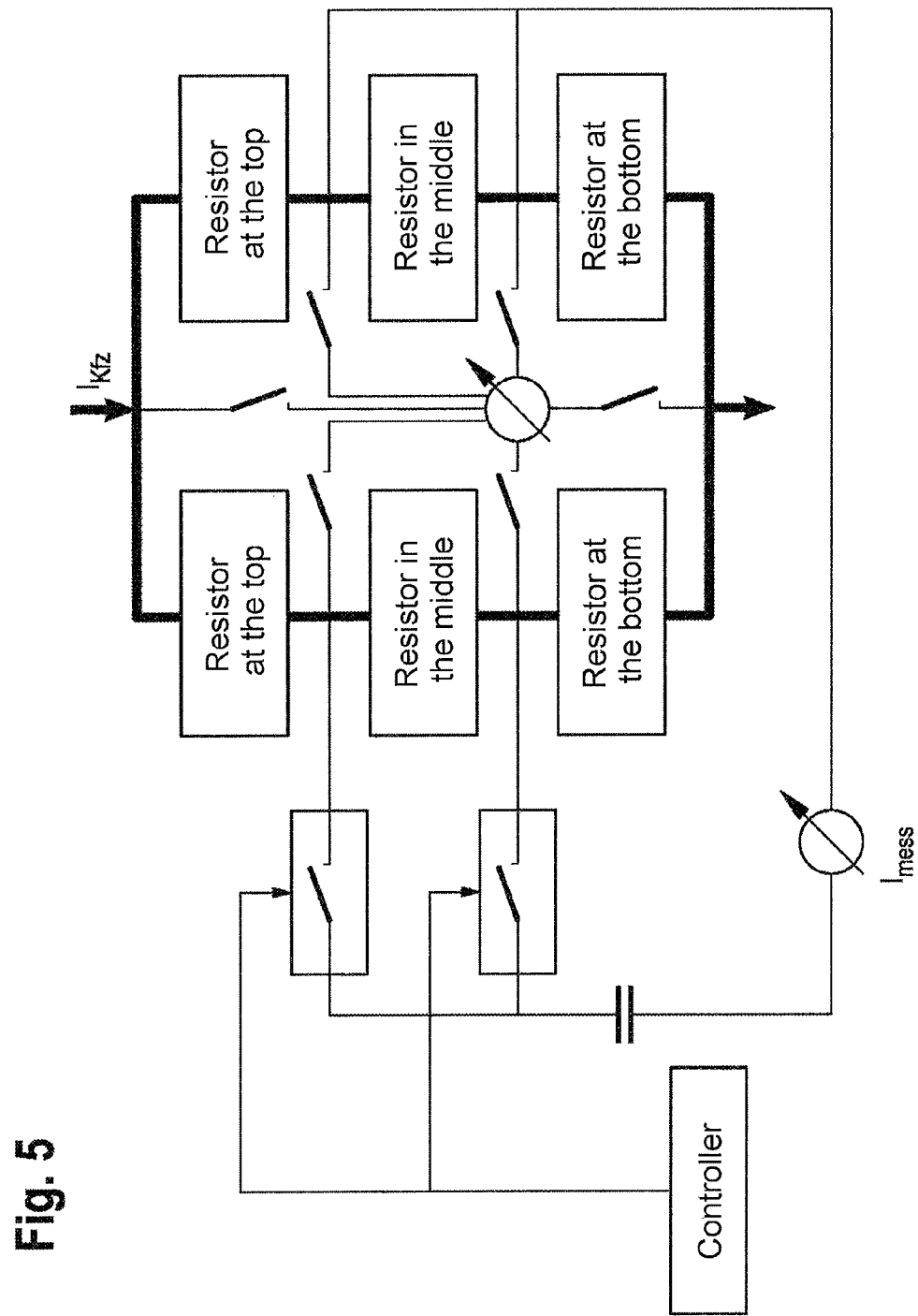
FIG. 5: shows a group of measuring resistors with connection according to a fifth exemplary embodiment.

FIG. 5 shows a group of measuring resistors with connection according to a fifth exemplary embodiment in which the resistor network contains three resistors connected in series (resistor at the top, resistor in the middle, resistor at the bottom) for each branch, to which the calibration current can be separately applied.

Figure 6:
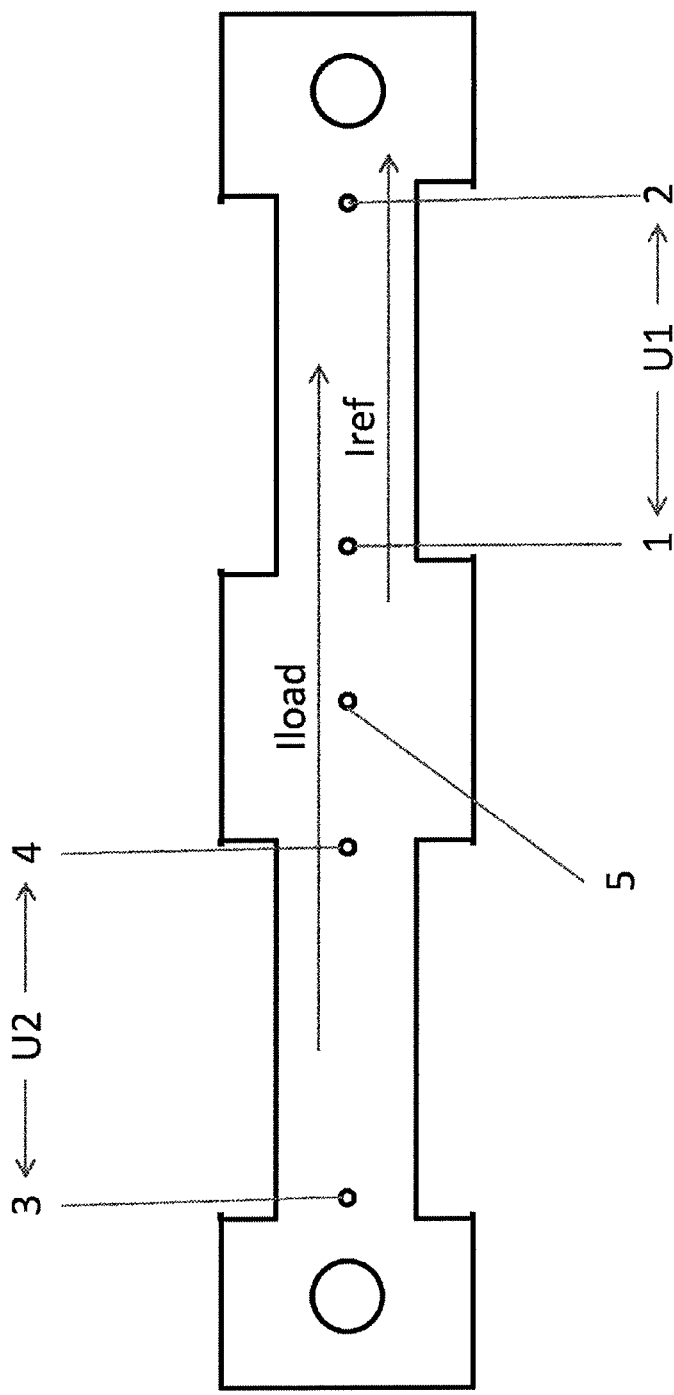
FIG. 6: electrical conductor according to a first exemplary embodiment.

FIG. 6 shows an electrical conductor according to a first exemplary embodiment. The electrical conductor has a first measurement path and a second measurement path. The first measurement path is defined by a first potential pick-up contacting means 1 and a second potential pick-up contacting means 2, at which a first voltage U1 can be detected across the first measurement path. The second measurement path is defined by a third potential pick-up contacting means 3 and a fourth potential pick-up contacting means 4, at which a second voltage U2 can be detected across the second measurement path.

The electrical conductor also has a first connection contact 21 for electrically contacting a cable, and a second connection contact 22 for electrically contacting a terminal post. The electrical conductor also has a current feed contacting means 5 for electrically contacting a device for providing a calibration current. The second measurement path and the first measurement path are located in series with each other between the first connection contact 21 and the second connection contact 22.

The current feed contacting means 5 is spaced at a first distance 12 from the first measurement path. The first measurement path is a conductor segment with a defined length, width 11 and height. The first potential pick-up contacting means 1 and the second potential pick-up contacting means 2 are formed at one edge of the first measurement path. The length of the first measurement path is thus defined by a distance between the first potential pick-up contacting means 1 and the second potential pick-up contacting means 2. The width 11 of the first measurement path, in particular, is greater than the height of the first measurement path. The first distance 12 in this exemplary embodiment is essentially the same size as the width 11 of the first measurement path.

The second measurement path is a conductor segment with a defined length, width 13 and height. The third potential pick-up contacting means 3 and the fourth potential pick-up contacting means 4 are formed at one edge of the second measurement path. The length of the second measurement path is thus defined by a distance between the first potential pickup contacting means 3 and the fourth potential pick-up contacting means 4. The width 13 of the second measurement path, in particular, is greater than the height of the second measurement path. The current feed contacting means 5 is spaced at a second distance 14 from the second measurement path. The second distance 14 in this exemplary embodiment is essentially the same size as the width 13 of the second measurement path.

The electrical conductor has a first subregion, in which the current feed contacting means 5 is arranged or formed. The length of the first subregion is bounded by the first measurement path and the second measurement path, or by the fourth potential pick-up contacting means 4 and the first potential pick-up contacting means 1. The first subregion has a greater width than the first measurement path 11 or the second measurement path 13.

The electric conductor is formed of a uniform material.

Figure 7:
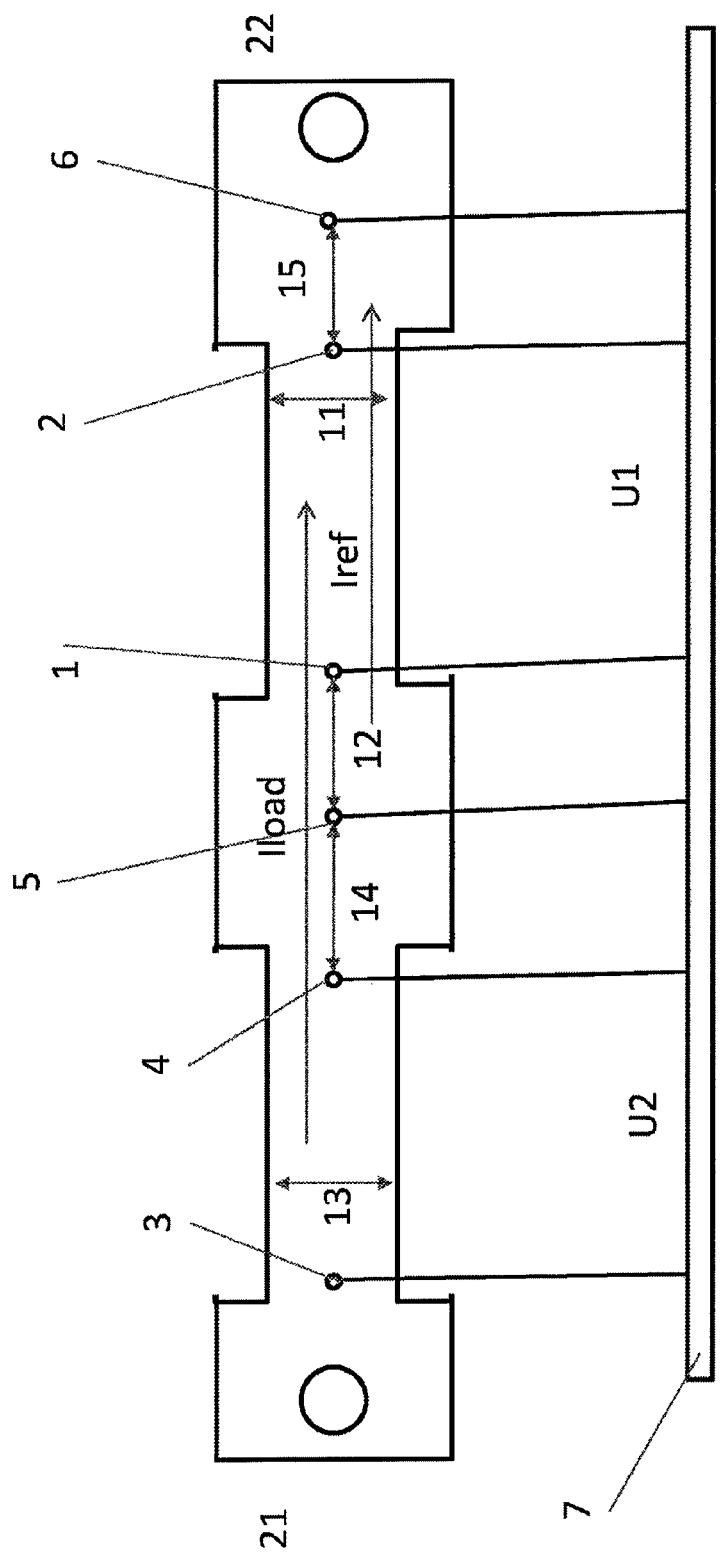
FIG. 7: current sensor according to a first exemplary embodiment.

The current sensor as shown in FIG. 7 comprises an electrical conductor according to a second exemplary embodiment.

The electrical conductor has a current output contacting means 6 to form a closed electrical circuit for the calibration current Iref. The current feed contacting means 6 is spaced at a third distance 15 from the first measurement path. The third distance 15 in this exemplary embodiment is essentially the same size as the width 11 of the first measurement path.

The electrical conductor has a second subregion, in which the current output contacting means 6 is arranged or formed. The length of the second subregion is bounded by the first measurement path and the second connection contact 22. The second subregion has a greater width than the first measurement path 11 or the second measurement path 13.

The current sensor has a first voltmeter, which is configured to measure a voltage U1 dropped across the first measurement path and/or electrically contacts the first potential pick-up contacting means 1 and the second potential pick-up contacting means 2 via a printed circuit board 7.

The current sensor has a second voltmeter, which is configured to measure a voltage U2 dropped across the second measurement path and/or electrically contacts the third potential pick-up contacting means 3 and the fourth potential pick-up contacting means 4 via the printed circuit board 7.

In addition, the current sensor has a device for providing a calibration current which can preferably be implemented as a capacitor and/or a high-precision current source and/or taps off a defined current from the vehicle battery. The device for providing a calibration current is configured to conduct or pass or feed in a calibration current Iref through the first measurement path. To this end, the device for providing a calibration current in particular electrically contacts the current feed contacting means 5 and particularly preferably, the current output contacting means 6 via the printed circuit board 7.

The current sensor also comprises a control device which is configured to carry out a method.

Figure 8:
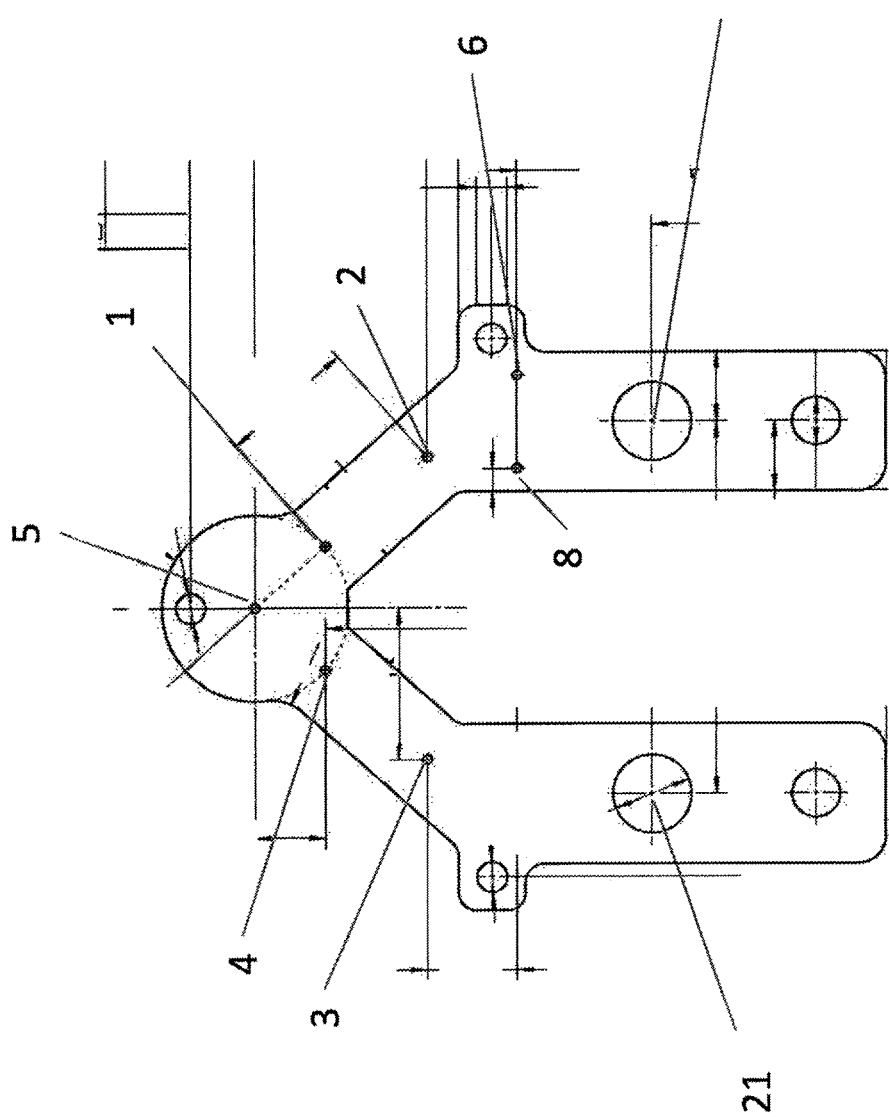
FIG. 8: electrical conductor according to a third exemplary embodiment.

FIG. 8 shows an electrical conductor according to a third exemplary embodiment. A distance from the second measurement path to the first measurement path, which is defined in particular by the distance from the fourth potential pick-up contacting means 4 to the first potential pick-up contacting means 1, is less than the sum of the distance between the fourth potential pick-up contacting means 4 and the current feed contacting means 5, and the distance between the current feed contacting means 5 and the first potential pick-up contacting means 1.

Connecting lines between the fourth potential pick-up contacting means 4, the current feed contacting means 5 and the first potential pick-up contacting means 1 form a triangle.

The second measurement path and the first measurement path are arranged at an angle to each other, in particular at a right angle. As a result, the first measurement path and the second measurement path do not lie on a straight line.

The electrical conductor has a first subregion, in which the current feed contacting means 5 is arranged or formed. The length of the first subregion is bounded by the second measurement path and the first measurement path. Two surfaces of the first subregion are designed to be oval-shaped or circular.

In addition, the electrical conductor has perforations which are used, in particular, for suspending or mounting the electrical conductor, in particular in the current sensor.

Figure 9:
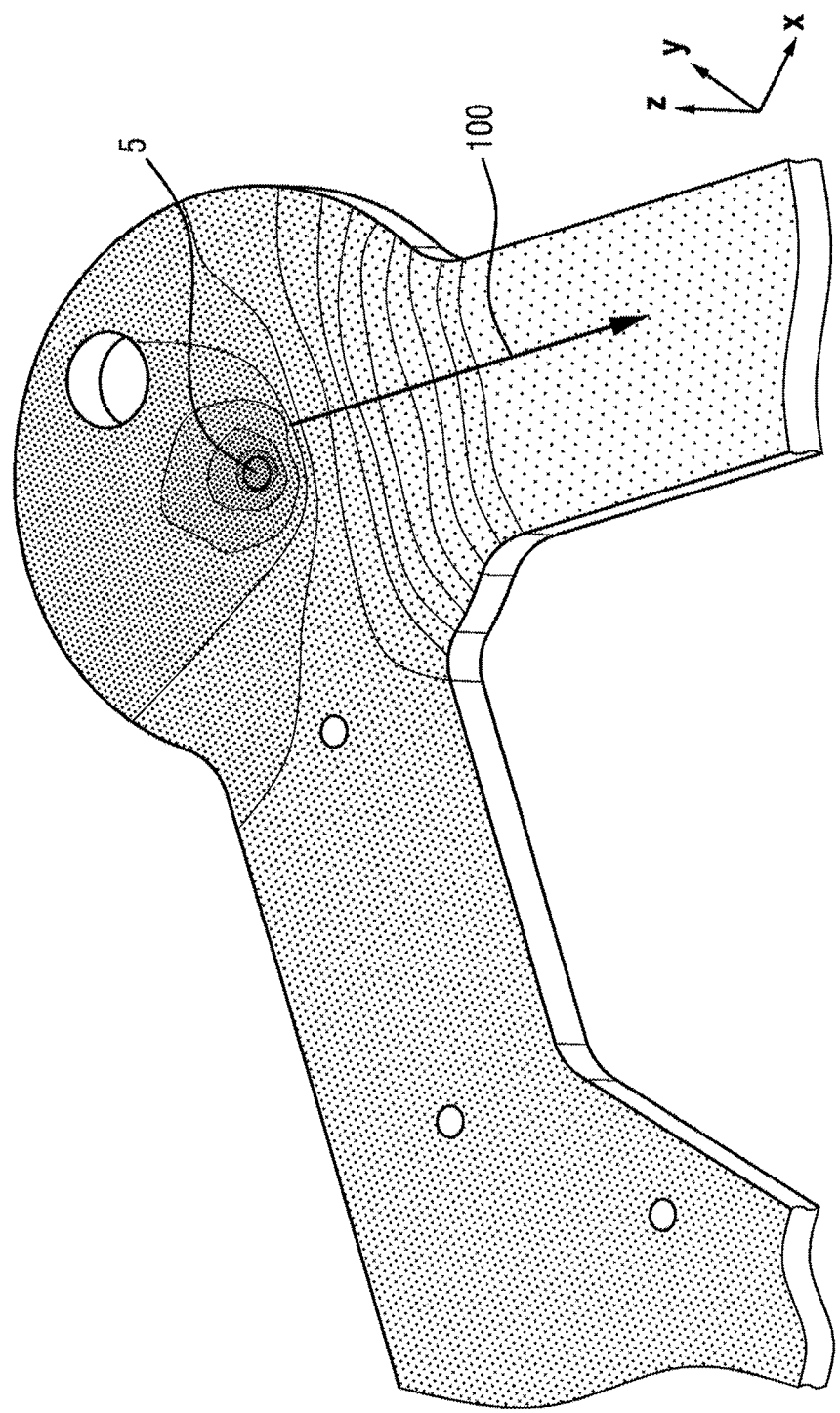
FIG. 9: simulation of the potential profile of the electrical conductor according to the third exemplary embodiment.
Figure 9:
Figure 10:
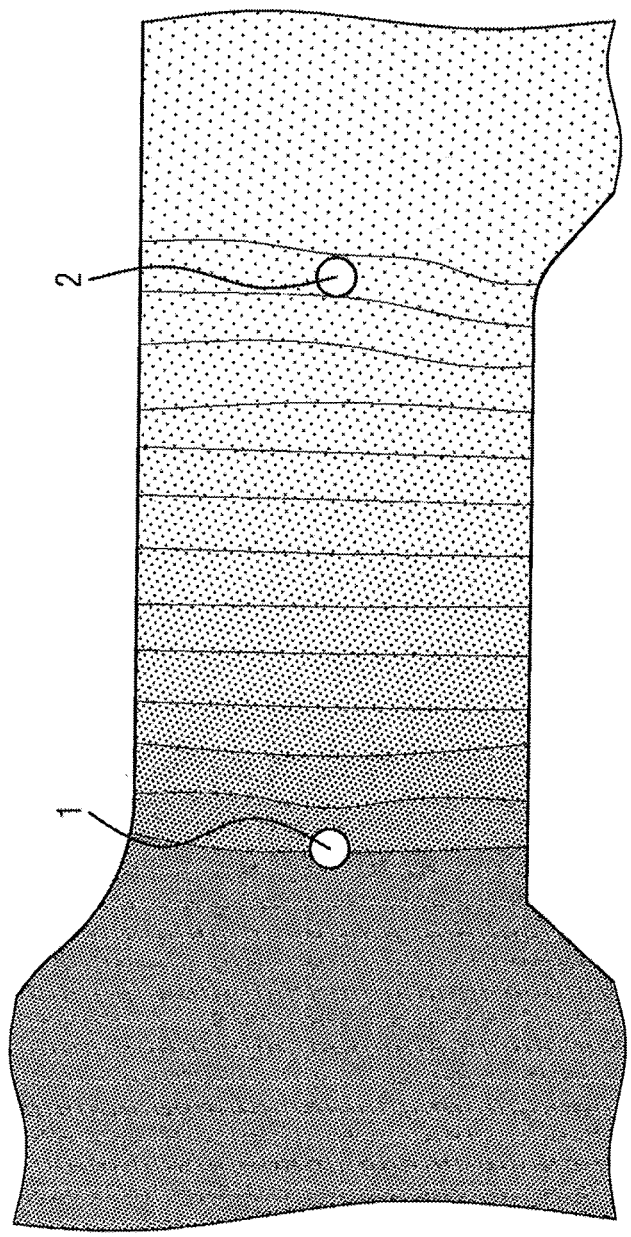
FIG. 10: simulation of the potential profile of the electrical conductor according to the third exemplary embodiment.
Figure 10:
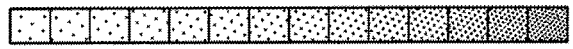
Figure 11:
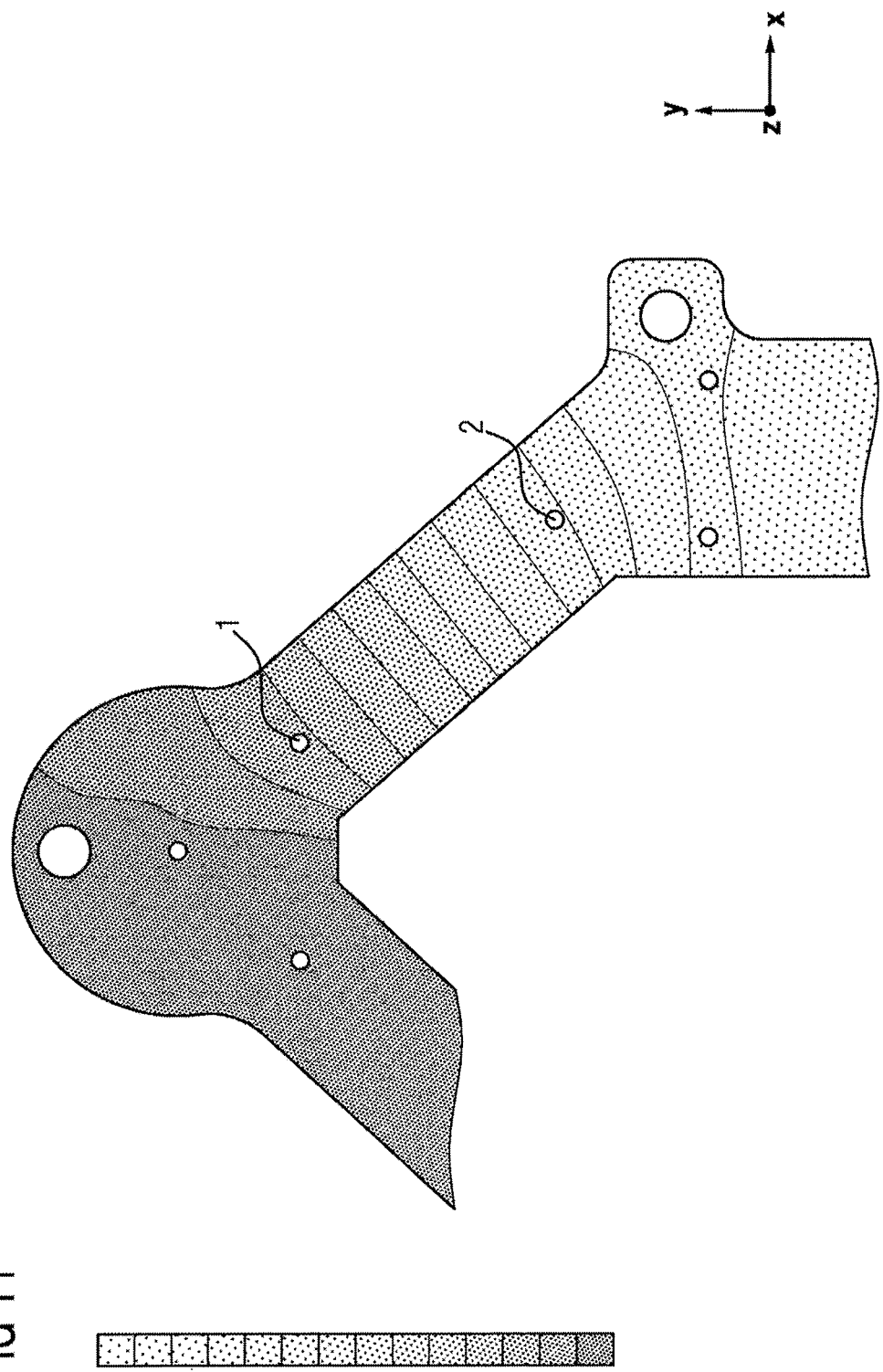
FIG. 11: simulation of the potential profile of the electrical conductor according to the third exemplary embodiment.

FIGS. 9, 10 and 11 show finite element simulation results of a potential profile or of equipotential areas on various surfaces of the electrical conductor and in different situations.

In FIG. 9 a calibration current Iref is injected into the current feed contacting means 5. FIG. 9 shows the locally high potential at the current feed contacting means 5, which is caused by the injection of the calibration current Iref. The locally high potential gives rise to annular or oval-shaped or circular equipotential surfaces or equipotential contours surrounding the current feed contacting means 5. This results, in particular, in a current flow, or current flow direction 100, oriented perpendicular to the equipotential areas or equipotential contours, resulting in an inhomogeneous current density distribution around the current feed contacting means. At some distance from the current feed contacting means 5 a homogeneous current density distribution is obtained, characterized in particular by equipotential surfaces or equipotential lines running parallel or perpendicular to the measurement path extent.

In addition, the current flow through the oval-shaped structure of the first subregion is supplied to the measurement path in particular in a funnel shape.

FIG. 10 shows the equipotential surfaces or equipotential contours of the first measurement path when a calibration current Iref is injected. The equipotential surfaces or equipotential contours are parallel to each other, resulting in a homogeneous current density profile being induced in or along the first measurement path.

In FIG. 11, only a load current Iload is fed in at the first connection contact 21. This also induces parallel equipotential surfaces or equipotential contours in the first measurement path, or a homogeneous current density profile. With equal sizes of the current intensity of the supplied load current and the injected calibration current, the result is converging equipotential surfaces or converging current density distributions or converging current density profiles or converging equipotential contours in the first measurement path.

Further explanations of extensions of aspects the invention are given below, in which case this is used, on the one hand, to explain the function and, on the other hand, the features described herein can also be combined in any desired manner with features described elsewhere. They may likewise be combined with one another and may constitute aspects essential to the invention separately or in combination.

A load current Iload to be measured is determined using a group of resistors through which the load current flows. The group of resistors has at least one first measurement path with a first measuring resistor R1 and one second measurement path with a second measuring resistor R2, which are connected in series with one another. Further measuring resistors R3, R4, . . . , Rn-1, Rn connected in series may be connected in parallel with these partial resistors connected in series.

In addition to the load current, a calibration current or a plurality of calibration currents is/are occasionally fed into this resistor network or group of measuring resistors, with the result that a calibration current or a part of the calibration current or some of the calibration currents flow(s) via one or more of these measuring resistors together with the load current or a part of the load current. The measuring resistors can be considered to be partial resistors of the group of measuring resistors.

In this case, the voltage drop across one or more partial resistors of the resistor network, which is caused by the sum of currents flowing via a measuring resistor, is measured.

The points at which the calibration current(s) is/are fed into the group of measuring resistors and the points via which the voltage measurements are carried out at the measuring resistors through which the current flows can now be selected in such a manner that a solvable system of equations results:

$$U_m = (I_{load,i} + I_{ref,m}) * R_m * g_m$$

$$U_n = (I_{load,i} + I_{ref,n}) * R_n * g_n$$

In this case $U_m$, $U_n$ are the measured calibration voltages across one or more measuring resistors with the number m, n, $R_m$, $R_n$ are the (unknown) measuring resistors across which the calibration voltages $U_m$, $U_n$ are measured. The measuring resistors may in turn comprise further measuring resistors connected in series or in parallel, $g_m$, $g_n$ are the (erroneous) gain factors of the measuring devices for the voltages $U_m$, $U_n$, $I_{load,i}$ is the load current to be measured or a part of this load current which flows via the measuring resistors in the group of measuring resistors used to measure calibration voltages $U_m$, $U_n$, $I_{ref,m}$ and $I_{ref,n}$ are applied calibration partial currents which flow via the measuring resistors $R_m$, $R_n$ in the group of measuring resistors used to measure the calibration voltages $U_m$, $U_n$, wherein $I_{ref,m}$ and $I_{ref,n}$ flow in different directions based on $I_{load,i}$.

In particular, the calibration partial currents or the calibration current is/are periodically applied, for example with a period duration of between 10 ms and 100 ms for a duration from a period of between 10 μs and 100 μs. The result is therefore times during which calibration currents or parts of the latter flow through measuring resistors in the group of measuring resistors, that is to say calibration periods, and times during which no calibration currents flow through the group of measuring resistors. At these times, that is to say outside calibration periods, at least some of the equations in the system of equations are simplified as $$U_m = I_{load,i} * R_m * g_m$$

$$U_n = I_{load,i} * R_n * g_n$$

In this case, $U_m$, $U_n$ denote measurement voltages, that is to say voltages measured outside calibration periods.

Alternatively, temporally variable calibration currents can be applied at the times during which calibration currents flow, that is to say within calibration periods.

Relationships $a_{mn}$ are advantageously formed between individual equations in the system of equations (or between measured voltages $U_i$) at times during which no calibration currents flow through the network (for example in a microcontroller which may be part of a current measuring apparatus or may be connected to the latter):

$$U_m = a_{mn} * U_n$$

or $$U_m = a_{mn} * I_{Load,i} * R_n * g_n$$

For example, voltage value pairs $U_n(t)$, $U_m(t)$ measured at the same times t in each case can be stored. These stored value pairs can be evaluated in the microcontroller by means of linear regression in order to determine the relationship $a_{mn}$. This corresponds to a calculation rule for the above-mentioned first operating parameter.

With the calibration currents switched on, it is advantageously now possible to determine that part of the load current to be measured by measuring the voltages $U_m$, $U_n$ $$U_m = a_{mn} * (I_{load,i} + I_{ref,m}) * R_n * g_n$$

$$U_n = (I_{Load,i} + I_{ref,n}) * R_n * g_n$$

as follows:

$$\frac{U_m}{\alpha_{mn} * R_n * g_n} = I_{load,i} + I_{ref,m}$$

$$\frac{U_n}{R_n * g_n} = I_{load,i} + I_{ref,n}$$

$$\frac{U_n}{R_n * g_n} - \frac{U_m}{\alpha_{mn} * R_n * g_n} = I_{ref,n} - I_{ref,m}$$

$$\frac{U_n}{(I_{ref,n} - I_{ref,m})} - \frac{U_m}{\alpha_{mn} * (I_{ref,n} - I_{ref,m})} = R_n * g_n$$

$$I_{load,i} = \frac{U_n}{R_n * g_n} - I_{ref,n}$$

The penultimate formula indicates a calculation rule for the second operating parameter.

At times during which no calibration current is applied, $I_{ref,m}=0$ and $I_{ref,n}=0$, and the last equation can be used to determine the load current $I_{load}$ to be measured.

With known $R_n$, $g_n$, alpha$_{nm}$, the following equation can be advantageously used to determine $I_{load}$:

$$I_{load,i} = \frac{1}{2} * \left( \frac{U_m}{R_m * g_m} + \frac{U_n}{R_n * g_n} - I_{ref,m} - I_{ref,n} \right)$$

$I_{load}$ can also be approximately calculated back from the sum of the two equations for the times during which the calibration current is switched on:

$$I_{load,i} = \frac{1}{2} * \left( \frac{U_m}{R_m * g_m} + \frac{U_n}{R_n * g_n} - I_{ref,m} - I_{ref,n} \right) =$$

$$\frac{1}{2} * \left( \frac{U_m}{R_m * g_m} + \frac{U_n}{R_n * g_n} \pm \|I_{ref,m}\| - \|I_{ref,n}\| \right)$$

An error is produced in this case, in particular when the currents $I_{ref,m}$ and $I_{ref,n}$ differ greatly.

The value $I_{ref,m} - I_{ref,n}$ is known in this case and corresponds to the calibration current, that is to say to the sum of the calibration partial currents. The different mathematical signs are taken into account in this case.

In the case of FIG. 1 described in more detail further below, the measurement of $I_{load}$ can be interrupted for the moment of the calibration process. For example, the measured value of $I_{load}$ for the calibration time can be formed from mean values of measured values before the calibration time and measured values after the calibration time. Alternatively, it is possible to decide whether the erroneous measured value is used or whether a replacement value is formed. The decision can be made, for example, on the basis of an instantaneous value of the "symmetry factor" $a_{mn}$ in comparison with earlier values of $a_{mn}$. However, the decision may also be made dependent on the size of the ratio of the error in comparison with the applied load current.

In this case, an advantage of the configuration in FIG. 2 described further below is apparent. Since the calibration current is applied only to one branch of the resistor network at a calibration time in each case, the relative error caused by $\pm\|I_{ref,m}\|-\|I_{ref,n}\|$ becomes smaller in relation to the sum of currents flowing through all branches. The respectively applied load current can be exactly calculated for the branches which are currently not calibrated since the sum of $U_n$ and $U_m$ is the same for all branches at any time irrespective of whether or not one of the branches is currently calibrated.

The measuring resistors $R_1, R_2, \ldots, R_{z-1}, R_z$ and the apparatuses for measuring the voltages $U_n, U_m$ may have tolerances or deviations from the desired value of virtually any desired size. The value of the calibration current also does not play a decisive role.

Only the following prerequisites are advantageously complied with:

Firstly: The ratio $a_{mn}$ of two products $R_n*g_n$, $R_m*g_m$ of measuring resistances $R_n$ and $R_m$ and gain factors $g_n, g_m$ to one another is intended to be substantially stable over a certain period. This certain period should be considerably longer than the period duration with which the periodically applied calibration currents are connected and disconnected or are periodically changed.

Secondly: The value of the calibration current $I_{ref}=I_{ref,n}-I_{ref,m}=|I_{ref,n}|+|I_{ref,m}|$ should be known exactly at at least one time at which $U_n$ and $U_m$ are measured with the calibration current applied.

It should now be pointed out that
1) the voltage drop is increased in one measuring resistor and the other is reduced, and
2) the resistance is calculated from the difference between the two measurement voltages.

This enables an up-to-date measurement of the resistance. Therefore, the resistance need not be permanently constant. More cost-effective materials can be used.

The described arrangement and the described method make it possible to determine the load current practically without prior knowledge of the resistor network or the group of measuring resistors and the relative accuracy of the measuring devices used to measure the voltages. As a result, despite the more cost-effective material, it is even possible to achieve a higher accuracy of the current measurement than in embodiments according to the prior art. This is because substantially both the tolerance of the resistance value of the measuring resistor and the tolerance of the voltage measuring apparatus for the voltage drop were previously included in the tolerance of the measured current value.

Typically, only accurate knowledge of $I_{ref}$ at one time is required with the apparatus or arrangement described. In addition, virtually no demands are imposed on the quality of the current source for $I_{ref}$. Only an accurate measurement of $I_{ref}$ is typically required. This can be easily achieved, for example, with an accordingly accurate reference resistor $R_{ref}$ and an accurate measurement of the voltage drop across $R_{ref}$. This is because, unlike the measuring resistor for the load current, $R_{ref}$ can have a high resistance of 1 ohm, for example, which needs to be designed only for small reference currents and not for high load currents. As a result of the value of $R_{ref}$ which is accordingly selected to be high, the voltage drop $I_{ref}*R_{ref}$ can also be conveniently measured since there is no need for a complicated amplifier, for example.

It should be understood that the first operating parameter is $alpha_{nm}$, in particular, and the second operating parameter is the product of the resistance and the gain factor, in particular.

Any desired subsets of the circuits shown can be fitted with discrete components on a printed circuit board, for example, or integrated in a semiconductor device. In addition, the discrete circuit or the semiconductor device may have further apparatuses, for example temperature sensors, in particular for measuring the temperature, at least one of the resistors Rref, R1, R2, ..., Rn, voltage sensors, in particular for measuring battery voltages, communication interfaces, apparatuses for controlling the current sources C1, C2, further current sources, clock generators, volatile and/or nonvolatile data memories, in particular for storing calibration data relating to the current measuring apparatus, for example a value of Rref determined in the manufacturing final test or a temperature coefficient of Rref, microprocessors, in particular for calculating physical variables of the battery or for calculating temperature models, in particular for calculating the battery temperature, the ambient temperature of the apparatus or for calculating a temperature of one or more of the resistors Rref, R1, ..., Rz used.

The entire arrangement or any desired subset of the apparatus can be installed, for example, in a plastic or metal housing with or without an integrated connector or can be injection-molded with a plastic.

The entire arrangement or any desired subset of said apparatuses, in particular the measuring resistors or shunt resistors R1, ..., Rz, can be integrated into a battery pole terminal, into a cable shoe, into a battery cable or into a battery.

The circuit may also contain one or more choppers for the voltages tapped off at the resistors Rref, R1, ..., Rz.

The circuit may also contain one or more sample-and-hold elements for voltages tapped off at the resistors Rref, R1, ..., Rz or for voltages tapped off or amplified there.

Finally, the calibration current Iref can also be measured using a current measuring method other than a voltage measurement using Iref, for example using a Hall sensor or other magnet-based measuring methods.

A derivation for the formulas mentioned above is also given below. Reference is made to the above description in respect of the meaning of the individual variables.

$$|I_{ref,1}| + |I_{ref,2}| = I_{ref}$$

$$I1 = I_{load} + |I_{ref,1}|$$

$$I2 = I_{load} - |I_{ref,2}|$$

$$U1 = R1 * g_1 * (I_{load} + |I_{ref,1}|)$$

$$U2 = R2 * g_2 * (I_{load} - |I_{ref,2}|)$$

$$a * R1 * g_1 = R2 * g_2$$

$$U2 = a * R1 * g_1 * (I_{load} - |I_{ref,2}|)$$

$$U1 - \frac{1}{a} * U2 = R1 * g_1 * (|I_{ref,1}| + |I_{ref,2}|)$$

$$R1 * g_1 = \frac{U1 - \frac{1}{a} * U2}{I_{ref}}$$

$$R2 * g_2 = a * R1 * g_1$$

The mentioned steps of the method according to an aspect of the invention can be executed in the indicated order. However, they can also be executed in a different order. In one of its embodiments, for example with a specific combination of steps, the method according to an aspect of the invention can be executed in such a way that no further steps are executed. However, in principle, further steps can also be executed, even steps of a kind which have not been mentioned.

The claims that are part of the application do not represent any dispensing with of the attainment of further protection. If it turns out in the course of the method that a feature or a group of features is not absolutely necessary, the applicant aspires right now to formulate at least one independent claim which no longer has the feature or the group of features. This may be, by way of example, a subcombination of a claim available on the filing date or may be a subcombination of a claim available on the filing date that is limited by further features.

Claims or combinations of features of this kind requiring rewording are intended to be understood to be covered by the disclosure of this application as well.

It should further be pointed out that configurations, features and variants of aspects of the invention that are described in the various embodiments or exemplary embodiments and/or shown in the figures are combinable with one another in any way. Single or multiple features can be interchanged with one another in any way. Combinations of features arising therefrom are intended to be understood to be covered by the disclosure of this application as well.

Back-references in dependent claims are not intended to be understood as dispensing with the attainment of independent substantive protection for the features of the back-referenced subclaims. These features can also be combined with other features in any way.

Features that are disclosed only in the description or features that are disclosed in the description or in a claim only in conjunction with other features may fundamentally be of independent significance essential to aspects of the invention. They can therefore also be individually included in claims for the purpose of distinction from the prior art.

For the purpose of better readability, some reference signs are represented in abbreviated form in the claims. The first operating parameter is thus denoted a, the second operating parameter is denoted R*g and the gain factor is denoted g. The indices used in the above description were dispensed with in this case.

The invention claimed is:

1. A current sensor for detecting a current out of or into a vehicle battery, comprising:
    a measurement circuit; and
    an electrical conductor coupled to the measurement circuit, the electrical conductor including:
    at least one first measurement path, defined between a first potential pick-up contact and a second potential pick-up contact separated from each other by a portion of the electrical conductor, a first voltage across the first measurement path being detectable across the first potential pick-up contact and the second potential pick-up contact,
    a first connection contact for electrically connecting a first end of the electrical conductor to an electrical connection element
    a second connection contact for electrically connecting a second end of the electrical conductor to a battery terminal,
    a current feed contact for electrically contacting an electrical source device for providing a calibration current to the electrical conductor, and
    geometrical parameters designed to converge current density distributions along the electrical conductor,
    wherein the first measurement path is electrically in series between the first connection contact and the second connection contact, wherein the geometrical parameters of the electrical conductor are such that a calibration current (Iref) supplied at the current feed contact and flowing through the electrical conductor to the second connection contact induces a first current density distribution in the first measurement path, the first current density distribution converging with a second current density distribution in the first measurement path, the second current density distribution being induced by a load current (Iload) of equal current intensity flowing through the electrical conductor from the first connection contact to the second connection contact.

2. The current sensor as claimed in claim 1, wherein the current feed contact is spaced at a first distance from the first measurement path, the first measurement path being a conductor segment with a defined length, width and height, the first potential pick-up contact and the second potential pick-up contact being arranged on one edge of the first measurement path, the length of the first measurement path being defined by a distance between the first potential pick-up contact and the second potential pick-up contact, wherein the width of the first measurement path is greater than the height of the first measurement path, the first distance being greater than ⅛ or ⅔ or ⅜ or ⁴⁄₈ or ⅝ or ⅚ or ⅞ or ⅝ of the width of the first measurement path.

3. The current sensor as claimed in claim 1, wherein the electrical conductor has a second measurement path, defined by a third potential pick-up contact and a fourth potential pick-up contact at which a second voltage across the second measurement path can be detected, the second measurement path being a conductor segment with a defined length, width and height, the third potential pick-up contact and the fourth potential pick-up contact being arranged on one edge of the second measurement path, the length of the second measurement path being thereby defined by a distance between the third potential pick-up contact and the fourth potential pick-up contact, wherein the width of the second measurement path is greater than the height of the second measurement path, the second measurement path and the first measurement path being implemented in series with each other between the first connection contact and the second connection contact, wherein the current feed contact is located in series between the second measurement path and the first measurement path.

4. The current sensor as claimed in claim 3, wherein the electrical conductor, on the basis of its geometrical parameters and contact, is implemented in such a way that a current density, induced by the calibration current supplied at the current feed contact, converges to zero in the second measurement path.

5. The current sensor as claimed in claim 4, wherein the current feed contact is spaced at a second distance from the second measurement path, the second distance being greater than ⅛ or ⅔ or ⅜ or ⁴⁄₈ or ⅝ or ⅚ or ⅞ or ⅝ of the width of the second measurement path.

6. The current sensor as claimed in claim 3, wherein the current feed contact is spaced at a second distance from the second measurement path, the second distance being greater than ⅛ or ⅔ or ¾ or ⁴⁄₈ or ⅝ or ⅚ or ⅞ or ⅝ of the width of the second measurement path.

7. The current sensor as claimed in claim 3, wherein the electrical conductor has a first subregion, in which the current feed contact is arranged, wherein the length of the first subregion is bounded by the first measurement path and second measurement path, the first subregion having a greater width and/or height and/or thicker material thickness than the first measurement path and/or the second measurement path.

8. The current sensor as claimed in claim 3, wherein a distance from the second measurement path to the first measurement path, which is defined by the distance from the fourth potential pick-up contact to the first potential pick-up contact, is less than the sum of the distances between the fourth potential pick-up contact and the current feed contact and between the current feed contact and the first potential pick-up contact.

9. The current sensor as claimed in claim 3, wherein the electrical conductor has a first subregion, in which the current feed contact is arranged, the length of the first subregion being bounded by the first measurement path and second measurement path, wherein at least one surface of the first subregion is oval-shaped.

10. The current sensor as claimed in claim 3, wherein the first measurement path and/or the second measurement path have a homogeneous current density distribution under a load current and calibration current that can be supplied.

11. The current sensor as claimed in claim 3, wherein the electrical conductor has a first subregion, in which the current feed contact is arranged, the length of the first subregion being bounded by the first measurement path and second measurement path, wherein two surfaces of the first subregion are oval-shaped.

12. The current sensor as claimed in claim 1, wherein the electrical conductor has a current output contact to form a closed circuit of the calibration current.

13. Tire current sensor as claimed in claim 12, wherein the current output contact is spaced at a third distance from the first measurement path, the first measurement path being a conductor segment with a defined length, width and height, the first potential pick-up contact and the second potential pick-up contact being arranged on one edge of the first measurement path, the length of the first measurement path being thereby defined by a distance between the first potential pick-up contact and the second potential pick-up contact, wherein the width of the first measurement path is greater than the height of the first measurement path, the third distance being greater than ⅛ or ⅔ or ⅜ or ⅘ or ⅝ or ⅚ or ⅞ or ⅜ of the width of the first measurement path.

14. The current sensor as claimed in claim 12, wherein the electrical conductor has a second subregion in which the current output contact is arranged, the length of the second subregion being bounded by the first measurement path and the second connection contact, the second subregion having a width, wherein the width is reduced and/or tapered in an area around the current output contact, the region around the current output contact having a constriction.

15. The current sensor claimed in claim 1, wherein the electrical conductor has a first subregion in which the current feed contact is arranged, wherein the first subregion has a width, the width being reduced and/or tapered in an area around the current feed contact, wherein the region around the current feed contact has a constriction.

16. The current sensor as claimed in claim 1, the electrical conductor being formed of a uniform material.

17. A method for determining a load current flowing through an electrical conductor of a current sensor, the current sensor including a measurement circuit, and an electrical conductor coupled to the measurement circuit, the electrical conductor including at least one first measurement path, defined between a first potential pick-up contact and a second potential pick-up contact separated from each other by a portion of the electrical conductor, a first voltage across the first measurement path being detectable across the first potential pick-up contact and the second potential pick-up contact, a first connection contact for electrically connecting a first end of the electrical conductor to an electrical connection element a second connection contact for electrically connecting a second end of the electrical conductor to a battery terminal, a current feed contact for electrically contacting an electrical source device for providing a calibration current to the electrical conductor, and geometrical parameters designed to converge current density distributions along the electrical conductor, wherein the first measurement path is electrically in series between the first connection contact and the second connection contact, the method comprising:

supplying a calibration current ($I_{ref}$) at the current feed contact and flowing through the electrical conductor to the second connection contact such that the geometrical parameters of the electrical conductor induce a first current density distribution in the first measurement path, the first current density distribution converging with a second current density distribution in the first measurement path, the second current density distribution being induced by a load current ($I_{load}$) of equal current intensity flowing through the electrical conductor from the first connection contact to the second connection contact, measuring the first voltage, which is dropped across the first measurement path, and calculating the load current on the basis of the first voltage.

* * * * *